(12) United States Patent
Flynn et al.

(10) Patent No.: US 9,935,634 B2
(45) Date of Patent: Apr. 3, 2018

(54) COMMUNICATION BETWEEN VOLTAGE DOMAINS

(71) Applicant: ARM Limited, Cambridge (GB)

(72) Inventors: David Walter Flynn, Cambridge (GB); James Edward Myers, Cambridge (GB)

(73) Assignee: ARM Limited, Cambridge (GB)

( * ) Notice: Subject to any disclaimer, the term of this patent is extended or adjusted under 35 U.S.C. 154(b) by 273 days.

(21) Appl. No.: 14/327,004

(22) Filed: Jul. 9, 2014

(65) Prior Publication Data

US 2015/0054563 A1     Feb. 26, 2015

(30) Foreign Application Priority Data

Aug. 21, 2013 (GB) .................................. 1314938.0
Sep. 2, 2013 (GB) .................................. 1315581.7

(51) Int. Cl.
*H03K 19/01*     (2006.01)
*H03K 19/0175*   (2006.01)

(52) U.S. Cl.
CPC .......................... *H03K 19/017509* (2013.01)

(58) Field of Classification Search
CPC ....................................................... G06F 1/14
See application file for complete search history.

(56) References Cited

U.S. PATENT DOCUMENTS

| 5,784,627 | A | * | 7/1998 | MacDonald | ............... | G06F 1/14 |
| | | | | | | 377/16 |
| 6,288,591 | B1 | * | 9/2001 | Riccio | .............. | H03K 3/356113 |
| | | | | | | 326/81 |
| 6,407,579 | B1 | * | 6/2002 | Goswick | ................ | G11C 5/145 |
| | | | | | | 326/63 |
| 6,600,358 | B1 | * | 7/2003 | Chan | ................... | H03K 19/0013 |
| | | | | | | 326/81 |
| 6,792,582 | B1 | * | 9/2004 | Cohn | ................... | G06F 17/5045 |
| | | | | | | 326/38 |
| 7,093,144 | B2 | | 8/2006 | Skroch | | |
| 2001/0013795 | A1 | * | 8/2001 | Nojiri | .............. | H03K 3/356113 |
| | | | | | | 326/81 |
| 2001/0043094 | A1 | * | 11/2001 | Clark | ............. | H03K 19/018585 |
| | | | | | | 327/112 |

(Continued)

FOREIGN PATENT DOCUMENTS

| JP | 5040183 | 2/1993 |
| JP | 2004-318878 | 11/2004 |
| JP | 2013-042278 | 2/2013 |

OTHER PUBLICATIONS

GB Search Report for GB Application No. 1315581.7, dated Feb. 26, 2014, 4 pages.

*Primary Examiner* — Jaweed A Abbaszadeh
*Assistant Examiner* — Gary Collins
(74) *Attorney, Agent, or Firm* — Nixon & Vanderhye P.C.

(57) ABSTRACT

An integrated circuit including a first voltage domain incorporates real time clock circuitry that communicates via communication circuitry with processing circuitry contained within a second voltage domain. The communication circuitry includes first parallel-to-serial conversion circuitry located within the first voltage domain, level shifting circuitry for passing serial signals between the voltage domains and second parallel-to-serial circuitry located in the second voltage domain.

16 Claims, 4 Drawing Sheets

(56) References Cited

U.S. PATENT DOCUMENTS

| | | | |
|---|---|---|---|
| 2002/0083352 A1* | 6/2002 | Fujimoto | G06F 1/26 713/300 |
| 2002/0167693 A1* | 11/2002 | Vrazel | G11C 27/02 398/27 |
| 2003/0231045 A1* | 12/2003 | Lundberg | H03K 17/102 327/333 |
| 2005/0094036 A1* | 5/2005 | Tichelaar | H04N 5/63 348/730 |
| 2005/0184757 A1* | 8/2005 | Skroch | G06F 1/06 326/63 |
| 2006/0190755 A1 | 8/2006 | Kim | |
| 2008/0282101 A1 | 11/2008 | Adams | |
| 2009/0022497 A1* | 1/2009 | Mateosky | H04L 27/2096 398/135 |
| 2009/0204835 A1 | 8/2009 | Smith et al. | |
| 2010/0146364 A1* | 6/2010 | Lee | G06F 13/4217 714/752 |
| 2010/0176864 A1* | 7/2010 | Yoo | H03K 3/012 327/333 |
| 2012/0049887 A1* | 3/2012 | Sood | H03K 3/356113 326/80 |
| 2012/0054511 A1 | 3/2012 | Brinks et al. | |
| 2012/0185703 A1 | 7/2012 | Machnicki et al. | |
| 2012/0261994 A1 | 10/2012 | Nikolov et al. | |
| 2013/0124895 A1 | 5/2013 | Saha et al. | |

* cited by examiner

COMMUNICATION BETWEEN VOLTAGE DOMAINS

This application claims priority to GB Application No. 1314938.0, filed on Aug. 21, 2013; and GB Application No. 1315581.7, filed on Sep. 2, 2013, the entire contents of each of which are hereby incorporated by reference.

BACKGROUND

This invention relates to the field of integrated circuits. More particularly, this invention relates to communication between different voltage domains within an integrated circuit.

It is known to provide integrated circuits operating with multiple voltage domains. For example, one voltage domain may be designed for low power operation, such as for a real time clock. Such a domain may use an unregulated power supply and thick gate oxide transistors. A further voltage domain within that integrated circuit may be targeted at low dynamic power and accordingly use a lower regulated voltage, such as to support a processor core. A difficulty arises in communicating signals between these voltage domains as the voltage difference increases and the demands for ever lower power consumption also increase.

SUMMARY

Viewed from one aspect the present invention provides an integrated circuit comprising:
first processing circuitry located within a first voltage domain and configured to operate at a first voltage;
second processing circuitry located within a second voltage domain and configured to operate at a second voltage, said second voltage being different from said first voltage; and
communication circuitry coupled to said first processing circuitry and to said second processing circuitry and configured to communicate one or more multi-bit signals between said first first processing circuitry and said second processing circuitry; wherein
said communication circuitry includes:
  first parallel-to-serial conversion circuitry configured to convert said one or more multi-bit signals between a parallel form processed by said first processing circuitry and a serial form for passing between said first voltage domain and said second voltage domain;
  level shifting circuitry configured to change a voltage level of said one or more multi-bit signal in said serial form between said first voltage and said second voltage; and
  second parallel-to-serial conversion circuitry configured to convert said one or more multi-bit signals between a parallel form processed by said second processing circuitry and said serial form for passing between said first voltage domain and said second voltage domain.

The present technique recognises that when communicating between a first voltage domain and a second voltage domain, the benefit that can be gained by reducing the number of signals which need to be passed between the domains with level shifting circuitry by using parallel-to-serial conversion circuitry on each side of the level shifting circuitry, more than compensates for the additional overhead associated with the parallel-to-serial conversion circuitry.

While it would be appreciated that the first processing circuitry could take a wide variety of different forms, the present technique is particularly useful when the first processing circuitry comprises real time clock circuitry configured to generate a real time clock value. Such real time clocks need to be run continuously and accordingly are designed to have low power. Communicating with the specialised low power voltage domains of such real time clock circuitry is made more efficient with the present techniques.

It will be appreciated that the multi-bit signals which are passed between the two voltage domains could take a wide variety of different forms. In the case of the first processing circuitry comprising real time clock circuitry, these multi-bit signals may include one or more of a time signal indicating a real time value to be passed from the real time clock circuitry to the second processing circuitry, a time setting signal indicating a real time value to which the real time clock circuitry is to be set and passed from the second processing circuitry to the real time clock circuitry, an alarm setting signal indicating an alarm value at which the real time clock circuitry is to trigger an alarm action and passed from the second processing circuitry to the real time clock circuitry, and an alarm signal indicating the reaching of an alarm time and passed from a real time clock circuitry to the second processing circuitry.

The second processing circuitry can take a wide variety of different forms. In the context of use with a real time clock circuitry, in some embodiments the second processing circuitry has one or more inactive sleep modes and the real time clock circuitry is configured to trigger a wake up response in the second processing circuitry when a predetermined real time value is reached so as to move the second processing circuitry from an inactive mode to an active mode.

In order to reduce the amount of signal traffic across the voltage domain, in some embodiments the second processing circuitry comprises a shadow time register to which a shadow time value from the real time clock circuitry is written. The second processing circuitry can then read this shadow time value rather than having to read the time value from the real time clock circuitry itself thereby avoiding a need to pass signals across the voltage domain boundary.

The shadow register may take a snapshot of the real time clock value with this being updated on a periodic basis in some embodiments such that the shadow time value tracks the real time value. Such an update signal and tracking action would not be performed when the second processing circuitry is in an inactive mode.

The real time clock circuitry may service a plurality of different further instances of processing circuitry which may each be formed within their own domain, or may share a voltage domain with the first processing circuitry. In this circumstance, each of the further processing circuitry may have associated communication circuitry for performing the parallel-to-serial conversions and the level shifting previously discussed. Thus, multiple ports using the interface of the present technique may be provided into one instance of real time clock circuitry.

The multi-bit signal which is passed across the interface between the voltage domains may in some embodiments be subject to a conversion between a first encoding used on one side of the domain boundary and a second encoding used on the other side of that domain boundary. For example, a Gray encoding may be advantageously used within a domain having a low static power and a high dynamic power so as to reduce the amount of signal switching, whereas on the other side of the voltage domain boundary a normal binary encoding may be used as this is more directly accessible and readily manipulated by standard processing techniques.

The first voltage domain may in some embodiments be an unregulated voltage as regulation of the voltage is typically power inefficient for very low power operation. The first voltage may in some embodiments be derived from a charge storage device (such as a battery or a super-capacitor), or by energy harvesting, and the first processing circuitry may use thick-gate-oxide transistors as these are well suited to low power application.

The second voltage domain may be voltage regulated, as this permits techniques such as dynamic voltage and frequency scaling to be employed within the second voltage domain. The second voltage will typically be lower than the first voltage.

Viewed from another aspect the present invention provides an integrated circuit comprising:

first processing means for performing first processing and located within a first voltage domain and configured to operate at a first voltage;

second processing means for performing second processing and located within a second voltage domain and configured to operate at a second voltage, said second voltage being different from said first voltage; and communication means for communicating one or more multi-bit signals between said first first processing circuitry and said second processing circuitry; wherein said communication means includes:

first parallel-to-serial conversion means for converting said one or more multi-bit signals between a parallel form processed by said first processing circuitry and a serial form for passing between said first voltage domain and said second voltage domain;

level shifting means for changing a voltage level of said one or more multi-bit signal in said serial form between said first voltage and said second voltage; and second parallel-to-serial conversion means for converting said one or more multi-bit signals between a parallel form processed by said second processing circuitry and a serial form for passing between said first voltage domain and said second voltage domain.

Viewed from a further aspect the present invention provides a method of operating an integrated circuit comprising the steps of:

performing first processing with first processing circuitry located within a first voltage domain and configured to operate at a first voltage;

performing second processing with second processing circuitry located within a second voltage domain and configured to operate at a second voltage, said second voltage being different from said first voltage; and communicating one or more multi-bit signals between said first processing circuitry and said second processing circuitry; wherein said step of communicating includes:

converting said one or more multi-bit signals between a parallel form processed by said first processing circuitry and a serial form for passing between said first voltage domain and said second voltage domain;

changing a voltage level of said one or more multi-bit signal in said serial form between said first voltage and said second voltage; and converting said one or more multi-bit signals between a parallel form processed by said second processing circuitry and a serial form for passing between said first voltage domain and said second voltage domain.

The above, and other objects, features and advantages of this invention will be apparent from the following detailed description of illustrative embodiments which is to be read in connection with the accompanying drawings.

DESCRIPTION OF EXAMPLE EMBODIMENTS

Figure 1:
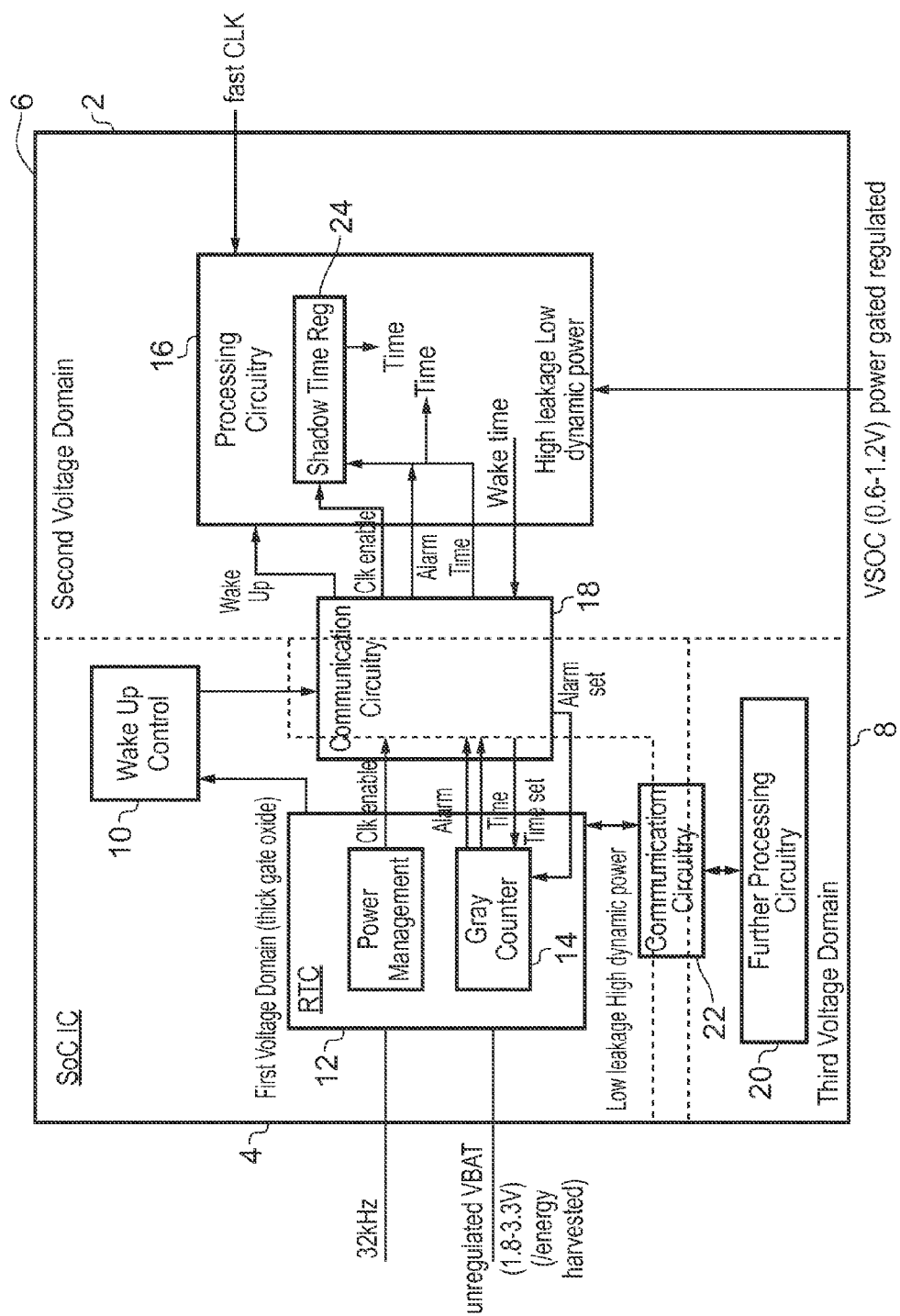
FIG. 1 schematically illustrates an integrated circuit including multiple voltage domains.

FIG. 1 schematically illustrates an integrated circuit 2 including a first voltage domain 4, a second voltage domain 6, and a third voltage domain 8. The first voltage domain 4 operates with an unregulated power supply derived from a charge storage device (such as a battery or a super-capacitor) or by energy harvesting and utilises thick-gate-oxide transistors for low power operation. The first voltage domain has a design aimed at achieving low current leakage so as to permit it to be continuously powered, but suffers from disadvantageously relatively high dynamic power consumption. The second voltage domain 6 is one which suffers from a relatively high leakage current but has a relatively low dynamic power consumption. The second voltage domain is supplied with a regulated power supply that may be power gated to reduce power consumption. Power gating of the power supply to the second voltage domain allows the circuitry within the second voltage domain to be placed into a sleep mode from which it may be woken using a wakeup signal generated by a wakeup controller 10 located within the first voltage domain.

The first voltage domain 4 includes real time clock circuitry 12 formed with thick-gate-oxide transistors. The real time clock circuitry 12 includes a Gray counter 14 for storing and updating a Gray encoded real time value. The real time clock circuitry 12 includes memory for storing Gray encoded alarm times which are compared with the current real time value within the Gray counter 14 and trigger an alarm or wakeup event when a match occurs. The alarm times stored are set using a multi-bit time setting signal sent to the real time clock circuitry 12 from processing circuitry 16 located within the second voltage domain.

Communication circuitry 18 is provided within the real time clock circuitry 12 and the processing circuitry 16. This communication circuitry 18 bridges between the different operating voltages that are used by the first domain 4 and the second domain 6. The operating voltage of the first domain 4 is higher than the operating voltage of the second domain 6. Accordingly, the communication circuitry 18 includes level shifting circuitry as will be described later.

Also provided within the integrated circuit 2 is the third voltage domain 8 which contains further processing circuitry 20. This further processing circuitry 20 may have its own associated communication circuitry 22 via which it communicates with the real time clock circuitry 12. Accordingly, the real time clock circuitry 12 may communicate via multiple ports with different processing circuitry 16, 20. The communication circuitry 22 may have a similar form to that of the communication circuitry 18.

The processing circuitry 16 within the second domain 6 includes a shadow time register 24 to which a shadow time value is written via the communication circuitry 18 from a multi-bit time value supplied by the real time clock signal. This multi-bit time signal is passed via the communication circuitry 18. When the processing circuitry 16 is active (e.g. not in a sleep mode), then a clock update signal supplied from the real time clock circuitry 12 may be used to update the shadow time value held within the shadow time register 24, such that the processing circuitry 16 can obtain a real time value from the shadow time register 24 rather than requiring to read the time value from the real time clock circuitry 12 itself.

The wakeup control circuitry 10 is triggered by the real time clock circuitry 12 reaching a wakeup time alarm value to generate and send a wakeup signal via the communication circuitry 18 to the processing circuitry 6. This can be supplied as an interrupt to the processing circuitry 6 and trigger it to exit its sleep state and back into an active mode in which it is performing processing.

The processing circuitry 16 is responsible for programming the real time clock circuitry 12 via the communication circuitry 18 and supplies to it a time setting signal (multi-bit), alarm settings for both general alarms (multi-bit) and wakeup alarms (multi-bit) as well as other parameters which may be necessary. The real time clock circuitry 12 passes back across the communication circuitry 18 to the processing circuitry 16 a real time clock value (multi-bit) and alarm signals as well as a shadow real time value update trigger.

Figure 2:
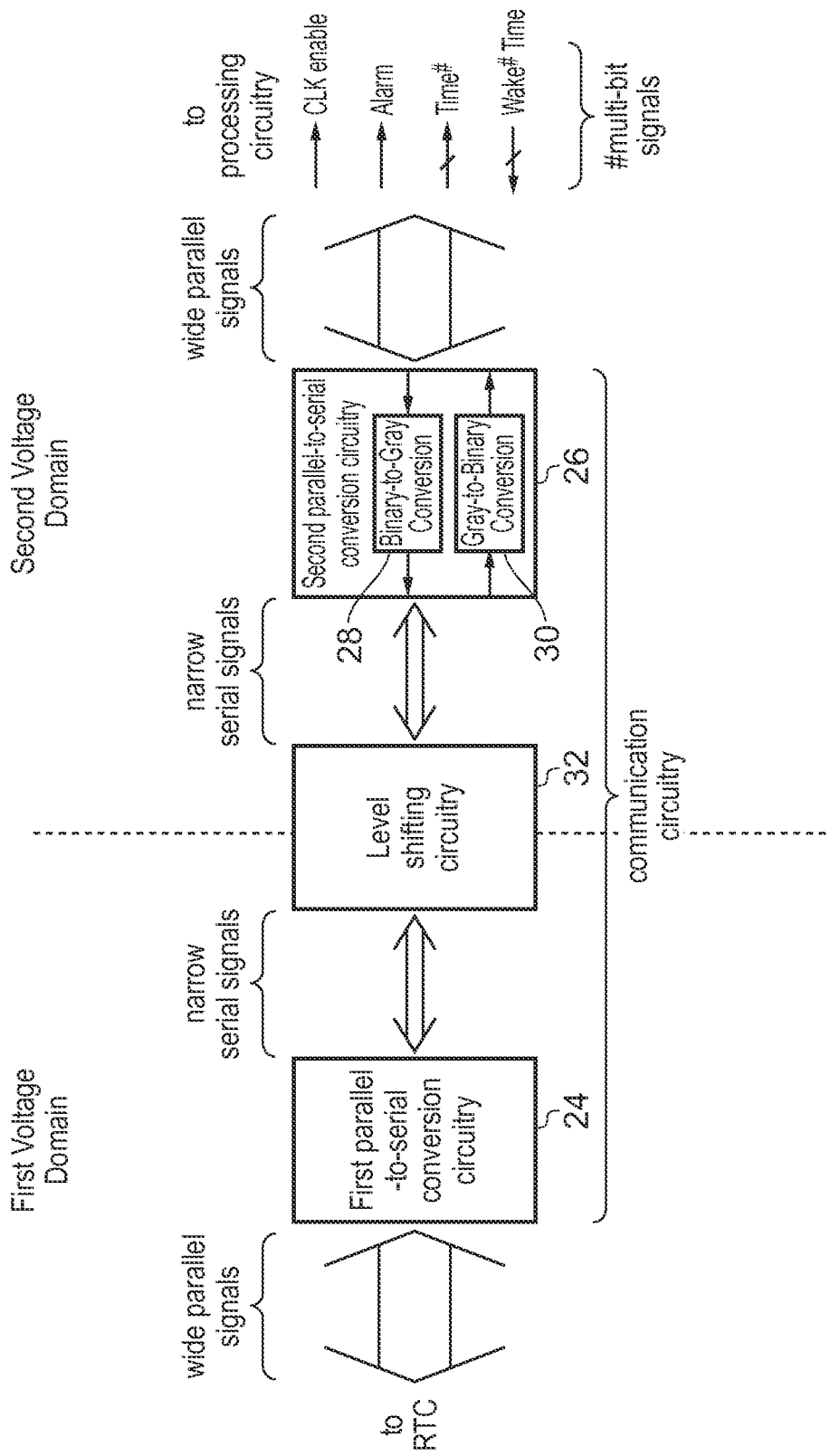
FIG. 2 schematically illustrates communication circuitry for passing multi-bit signals between voltage domains.

FIG. 2 schematically illustrates the communication circuitry 18 in more detail. Within the first voltage domain there is provided first parallel to serial conversion circuitry 24. Within the second voltage domain there is provided second parallel-to-serial conversion circuitry 26. The second parallel-to-serial conversion circuitry 26 includes a binary-to-Gray converter 28 for sending binary values from the second voltage domain to the first voltage domain (which uses Gray encoding). A Gray-to-binary converter 30 is provided within the second parallel-to-serial conversion circuitry 16 for receiving signals in the opposite direction, namely receiving Gray encoded signals and converting these into binary encoded signals for use within the second voltage domain. It will be appreciated that these encoding converters 28, 30 could be provided at other positions within the communication circuitry 18, e.g. within the first voltage domain. The binary-to-Gray conversion may be performed in a variety of different manners, such as a bit-serial manner if desired.

FIG. 2 illustrates how the wide parallel signals including multi-bit signals representing at least the wakeup time and time value are converted into narrow serial signals before they are passed across the interface between the voltage domains by level shifting circuitry 32. Reducing the number of signals which need to be passed across this voltage domain interface reduces the overhead associated with this level shifting and accordingly increases efficiency in a manner which surprisingly more than compensates for the need to perform the parallel-to-serial conversions on either side of the interface.

It will be appreciated that the parallel-to-serial conversions performed serve the function of making narrower the signals pass between the domains. A parallel signal need not be converted to a single bit serial stream, but could be simply made narrower, e.g. a 32-bit parallel signal might be reduced to a two-bit signal that is then serially transmitted over, for example, 16 clock periods to represent the original 32-bit signal.

Figure 3:
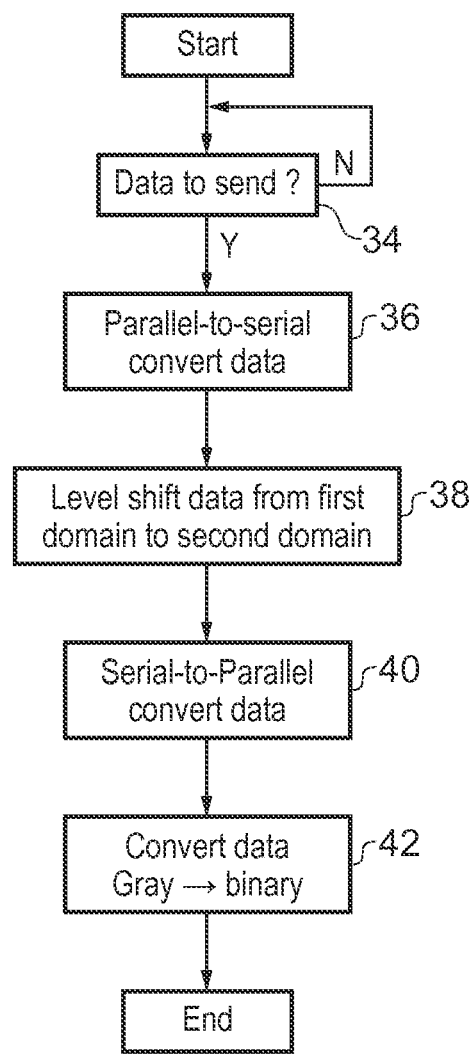
FIG. 3 is a flow diagram schematically illustrating the process of sending a multi-bit signal from a first domain to a second domain.

FIG. 3 is a flow diagram schematically illustrating the passing of a multi-bit signal from the first domain to the second domain. At step 34 processing waits until there is data to send. Step 36 then performs a parallel-to-serial conversion on this multi-bit data. Step 38 level shifts the serial data generated from the first domain to the second domain. Step 40 converts the serial data received in the second domain back from serial form to the parallel form. Step 42 converts the received parallel data from its Gray encoding to a binary encoding. It will be appreciated that the encoding conversion could be performed on the other side of the domain boundary in some embodiments.

Figure 4:
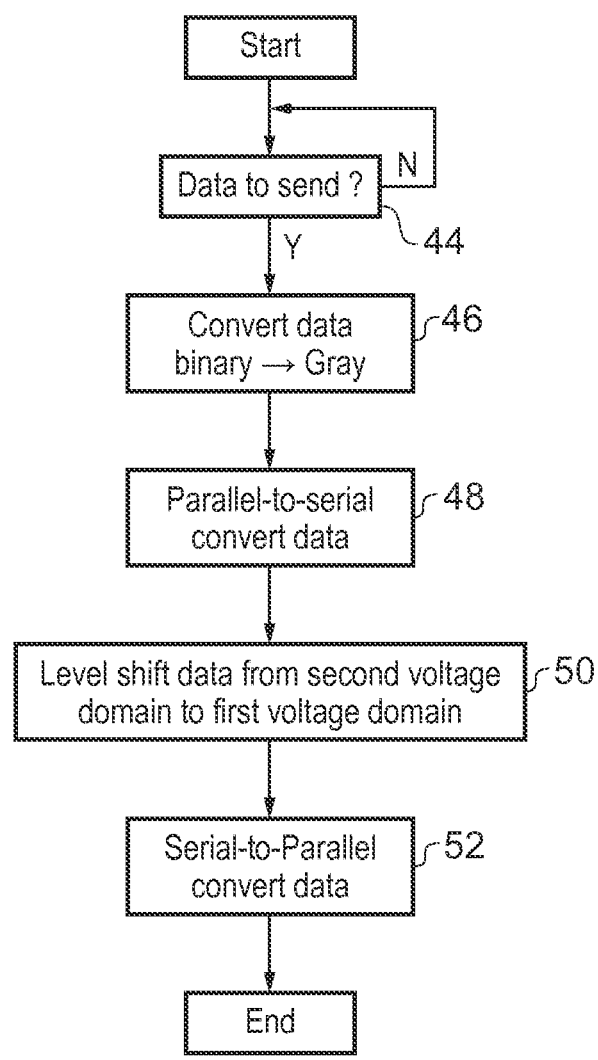
FIG. 4 is a flow diagram schematically illustrating the process of sending a multi-bit signal from a second domain to a first domain.

FIG. 4 is a flow diagram schematically illustrating communicating a multi-bit signal from the second domain to the first domain. At step 44 processing waits until there is data to send. Step 46 converts the multi-bit data from a binary encoding to a Gray encoding. Step 48 converts the parallel multi-bit signal value to a serial representation. Step 50 performs a level-shift on the serial data from the second voltage domain to the first voltage domain. Step 52 converts the serial data received in the first voltage domain from a serial form back to a parallel form.

Although illustrative embodiments of the invention have been described in detail herein with reference to the accompanying drawings, it is to be understood that the invention is not limited to those precise embodiments, and that various changes, additions and modifications can be effected therein by one skilled in the art without departing from the scope and spirit of the invention as defined by the appended

The invention claimed is:

1. An integrated circuit comprising:
   first processing circuitry located within a first voltage domain and configured to operate at a first voltage;
   second processing circuitry located within a second voltage domain and configured to operate at a second voltage, said second voltage being different from said first voltage; and
   communication circuitry coupled to said first processing circuitry and to said second processing circuitry and configured to communicate one or more multi-bit signals between said first processing circuitry and said second processing circuitry; wherein
   said communication circuitry includes:
      first parallel-to-serial conversion circuitry configured to convert said one or more multi-bit signals between a parallel form processed by said first processing circuitry and a serial form for passing from said first voltage domain to said second voltage domain;
      level shifting circuitry configured to change a voltage level of said one or more multi-bit signals in said serial form between said first voltage and said second voltage; and
      second parallel-to-serial conversion circuitry configured to convert said one or more multi-bit signals between a parallel form processed by said second processing circuitry and said serial form for passing from said second voltage domain to said first voltage domain,
   wherein at least one of said first parallel-to-serial conversion circuitry and said second parallel-to-serial conversion circuitry is configured to convert said multi-bit signal between a first encoding used by said first processing circuitry to represent a value and a second encoding used by said second processing circuitry to represent said value.

2. An integrated circuit as claimed in claim 1, wherein said first processing circuitry comprises real time clock circuitry configured to generate a real time clock value.

3. An integrated circuit as claimed in claim 2, wherein said one or more multi-bit signals comprise at least one of:
   a time signal indicating a real time value passed from said real time clock circuitry to said second processing circuitry;
   a time setting signal indicating a real time value to which said real time clock circuitry is to be set and passed from said second processing circuitry to said real time clock circuitry;
   an alarm setting signal indicating an alarm value at which said real time clock circuitry is to trigger an alarm action and passed from said second processing circuitry to said real time clock circuitry; and
   an alarm signal indicating reaching an alarm time and passed from said real time clock circuitry to said second processing circuitry.

4. An integrated circuit as claimed in claim 2, wherein said second processing circuitry has one or more inactive modes and said real time clock signal is configured to trigger a wake-up response in said second processing circuitry when a predetermined real time value is reached to move said second processing circuitry from one of said one or more inactive modes to an active mode.

5. An integrated circuit as claimed in claim 2, wherein said second processing circuitry comprises a shadow time register in to which a shadow time value from said real time clock circuitry is written.

6. An integrated circuit as claimed in claim 5, wherein said real time clock circuitry is configured to send an update signal to said shadow time register to update said shadow time value to track said real time value.

7. An integrated circuit as claimed in claim 6, wherein said update signal is not sent when said second processing circuitry is in an inactive mode.

8. An integrated circuit as claimed in claim 2, comprising a plurality of further processing circuitry coupled to said real time clock circuitry and configured to operate in a voltage domain different from said first voltage domain and at a voltage different from said first voltage.

9. An integrated circuit as claimed in claim 1, wherein said first encoding is a Gray encoding and said second encoding is a binary encoding.

10. An integrated circuit as claimed in claim 1, wherein said first voltage is an unregulated voltage.

11. An integrated circuit as claimed in claim 10, wherein said first voltage is derived by one of:
   directly from charge storage device; and
   energy harvesting.

12. An integrated circuit as claimed in claim 1, wherein said first processing circuitry is formed using transistors having a thicker gate oxide than transistors forming said second processing circuitry.

13. An integrated circuit as claimed in claim 1, wherein said second voltage is a regulated voltage.

14. An integrated circuit as claimed in claim 1, wherein said second voltage is lower than said first voltage.

15. An integrated circuit comprising:
   first processing means for performing first processing and located within a first voltage domain and configured to operate at a first voltage;
   second processing means for performing second processing and located within a second voltage domain and configured to operate at a second voltage, said second voltage being different from said first voltage; and
   communication means for communicating one or more multi-bit signals between said first processing means and said second processing means; wherein
   said communication means includes:
      first parallel-to-serial conversion means for converting said one or more multi-bit signals between a parallel form processed by said first processing means and a serial form for passing from said first voltage domain to said second voltage domain;
      level shifting means for changing a voltage level of said one or more multi-bit signals in said serial form between said first voltage and said second voltage; and
      second parallel-to-serial conversion means for converting said one or more multi-bit signals between a parallel form processed by said second processing means and a serial form for passing from said second voltage domain to said first voltage domain;
   wherein at least one of said first parallel-to-serial conversion means and said second parallel-to-serial conversion means is configured to convert said multi-bit signal between a first encoding used by said first processing means to represent a value and a second encoding used by said second processing means to represent said value.

16. A method of operating an integrated circuit comprising the steps of:
   performing first processing with first processing circuitry located within a first voltage domain and configured to operate at a first voltage;
   performing second processing with second processing circuitry located within a second voltage domain and configured to operate at a second voltage, said second voltage being different from said first voltage; and
   communicating one or more multi-bit signals between said first processing circuitry and said second processing circuitry; wherein
   said step of communicating includes:
      converting said one or more multi-bit signals between a parallel form processed by said first processing circuitry and a serial form for passing from said first voltage domain to said second voltage domain;
      changing a voltage level of said one or more multi-bit signals in said serial form between said first voltage and said second voltage;
      converting said one or more multi-bit signals between a parallel form processed by said second processing circuitry and a serial form for passing from said second voltage domain to said first voltage domain; and
      converting said multi-bit signal between a first encoding used by said first processing circuitry to represent a value and a second encoding used by said second processing circuitry to represent said value.

* * * * *